US012188784B2

(12) United States Patent
Imhof et al.

(10) Patent No.: US 12,188,784 B2
(45) Date of Patent: Jan. 7, 2025

(54) VAPOR CELL FOR ATOMIC PHYSICS SENSORS

(71) Applicants: Eric A. Imhof, Albuquerque, NM (US); Thomas G. Spence, Ellicott City, MD (US); Steven Ryan Jefferts, Woodland Hills, CA (US); Michael D. Bulatowicz, Sun Prairie, WI (US)

(72) Inventors: Eric A. Imhof, Albuquerque, NM (US); Thomas G. Spence, Ellicott City, MD (US); Steven Ryan Jefferts, Woodland Hills, CA (US); Michael D. Bulatowicz, Sun Prairie, WI (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 256 days.

(21) Appl. No.: 17/552,909

(22) Filed: Dec. 16, 2021

(65) Prior Publication Data

US 2022/0196444 A1 Jun. 23, 2022

Related U.S. Application Data

(60) Provisional application No. 63/126,704, filed on Dec. 17, 2020, provisional application No. 63/126,978, filed on Dec. 17, 2020.

(51) Int. Cl.
*G01D 11/24* (2006.01)
*G04F 5/14* (2006.01)

(52) U.S. Cl.
CPC .............. *G01D 11/245* (2013.01); *G04F 5/14* (2013.01)

(58) Field of Classification Search
CPC .................................................... G01D 11/245
See application file for complete search history.

(56) References Cited

U.S. PATENT DOCUMENTS

| 3,858,615 A * | 1/1975 | Weigl ................ F16L 11/118 138/121 |
| 10,056,913 B1 * | 8/2018 | Roper ................ G01C 19/62 |
| 10,545,461 B1 | 1/2020 | Roper et al. |

(Continued)

FOREIGN PATENT DOCUMENTS

| CN | 201968603 U | 9/2011 |
| CN | 206090782 | 4/2017 |

(Continued)

OTHER PUBLICATIONS

International Search Report for corresponding PCT/US2021/063829, mailed Apr. 13, 2022.

(Continued)

*Primary Examiner* — Jamel E Williams
(74) *Attorney, Agent, or Firm* — Tarolli, Sundheim, Covell & Tummino LLP

(57) ABSTRACT

One embodiment includes a vapor cell for an atomic physics-based sensor system. The vapor cell includes a cell wall formed from an approximately transparent material. The cell wall can enclose an alkali metal vapor and can include an inner surface and an outer surface. The vapor cell can also include at least one structural feature provided on at least one of the inner surface and the outer surface of the cell wall and extending along a portion of the respective at least one of the inner surface and the outer surface.

19 Claims, 2 Drawing Sheets

(56) References Cited

U.S. PATENT DOCUMENTS

2011/0128002 A1  6/2011  Fujiwara et al.
2016/0363617 A1* 12/2016  Anderson .......... G01R 29/0885

FOREIGN PATENT DOCUMENTS

| JP | 2010013743 A1 | 1/2012 |
| JP | 5297095 B2 | 9/2013 |
| JP | 2015019471 A1 | 3/2017 |
| JP | 2018133644 A | 8/2018 |
| JP | 2019036127 A | 3/2019 |

OTHER PUBLICATIONS

Examination Report #2: Issued Jul. 25, 2024 for corresponding AU 2021401294.
Fan, et al.: "Effect of Vapor Cell Geometry on Rydberg Atom-based Radio-frequency Electric Field Measurements"; Phys. Rev. Applied 4, 044015-Published Oct. 22, 2015; DOI: 10.1103/PhysRevApplied.4.044015.
Examination Report #1: Issued Mar. 26, 2024 for corresponding AU 2021401294.
JPOA (Japanese Office Action) issued Jul. 23, 2024 for corresponding JP 2023-537072; attached with translation.
EPOA: Office Action issued Jun. 8, 2024 for corresponding EP 21 907 825.0-1122.
Cutler, et al: "Nanostructured Alkali-Metal Vapor Cells", Physical Review Applied, vol. 14, No. 3, Sep. 1, 2020 (Sep. 1, 2020), XP055939729, DOI: 10.1103/PhysRevApplied.14.034054.
Knappe, et al: "Compact atomic vapor cells fabricated by laserinduced heating of hollow-core glass fibers", Review of Scientific Instruments, American Institute of Physics, 2 Huntington Quadrangle, Melville, NY 11747, vol. 74, No. 6, Jun. 1, 2003 (Jun. 1, 2003), pp. 3142-3145, XP012040892, ISSN: 0034-6748, DOI: 10.1063/1.1575925.
Baluktsian, et al: "Fabrication method for microscopic vapor cells for alkali atoms", Optics Letters, Optical Society of America, US, vol. 35, No. 12, Jun. 15, 2010 (Jun. 15, 2010), pp. 1950-1952, XP001554823, ISSN: 0146-9592, DOI: 10.1364/0L.35.001950.
Balabas: "Rubidium 'whiskers' in a vapour cell", Nature Physics, vol. 3, No. 1, Jan. 1, 2007 (Jan. 1, 2007), pp. 2-2, XP093166378, GB ISSN: 1745-2473, DOI: 10.1038/nphys496.
Anonymous: "Triad Technology Inc. I Spectroscopic Solutions", Dec. 18, 2019 (Dec. 18, 2019), XP093166447, Retrieved from the Internet: URL:https://web.archive.org/web/20191218125049/https://www.triadtechno.com/anti-reflective-coated-reference-cells.html.
Daschner: "Addressable Rubidium vapor cells for optical and electrical read-out of Rydberg excitations", Apr. 20, 2015 (Apr. 20, 2015), pp. 1-195, XP093166595, Retrieved from the Internet: URL:https://www.pi5.uni-stuttgart.de/documents/abgeschlossene-arbeiten/2015-Daschner-Renate-Addressable-Rubidium-vapor-cells-for-optical-andelectrical-read-out-of-Rydberg-excitations-PhD.pdf(Part 1,2,3).

* cited by examiner

VAPOR CELL FOR ATOMIC PHYSICS SENSORS

CROSS REFERENCE TO RELATED APPLICATION

This application claims priority from U.S. Provisional Patent Application No. 63/126,704, filed 17 Dec. 2020, and from U.S. Provisional Patent Application No. 63/126,978, filed 17 Dec. 2020, which are both incorporated herein by reference in their entirety.

TECHNICAL FIELD

The present invention relates generally to sensor systems, and specifically to a vapor cell for atomic physics sensors.

BACKGROUND

A variety of high-precision sensor systems implement atomic physics for measuring any of a variety of parameters, such as time, inertial parameters, magnetic fields, and electric fields. Such high-precision sensor systems typically include optical and/or radio frequency (RF) signals that interact with atoms (e.g., alkali metal atoms) that are provided in a vapor matter state within a vapor cell. Examples of such sensor systems include nuclear magnetic resonance (NMR) sensors, electron paramagnetic resonance (EPR) sensors, interferometer sensors, and/or electrometer sensors. The sensor systems typically include one or more optical beams that are provided through the vapor cell, such that a characteristic of a detection beam exiting the vapor cell is monitored. The interaction of the optical beam(s) and some external stimulus (e.g., a magnetic field, RF signal, etc.) with the atoms contained in the vapor cell can provide for the measurable parameter of the monitored detection beam to facilitate the measurement of a measurable parameter (e.g., rotation, acceleration, magnetic field, electric field, and/or time).

SUMMARY

One embodiment includes a vapor cell for an atomic physics-based sensor system. The vapor cell includes a cell wall formed from an approximately transparent material. The cell wall can enclose an alkali metal vapor and can include an inner surface and an outer surface. The vapor cell can also include at least one structural feature provided on at least one of the inner surface and the outer surface of the cell wall and extending along a portion of the respective at least one of the inner surface and the outer surface.

Another example includes a method for forming a vapor cell for an atomic physics-based sensor system. The method includes forming a cell wall from an approximately transparent material. The cell wall includes an inner surface and an outer surface. The method also includes forming at least one structural feature on at least one of the inner surface and the outer surface of the cell wall and extending along a portion of the respective at least one of the inner surface and the outer surface. The method further includes sealing the vapor cell to enclose an alkali metal vapor within the vapor cell.

Another example includes an atomic physics-based sensor system. The system includes a vapor cell. The vapor cell includes a cell wall formed from an approximately transparent material. The cell wall can enclose an alkali metal vapor and can include an inner surface and an outer surface. The vapor cell can also include at least one structural feature provided on at least one of the inner surface and the outer surface of the cell wall and extending along a portion of the respective at least one of the inner surface and the outer surface. The system also includes at least one laser configured to provide a respective at least one optical beam through the vapor cell and at least one radio frequency (RF) signal generator configured to provide an RF signal through the vapor cell. The system further includes a detection system configured to monitor a detection beam corresponding to one of the at least one optical beam exiting the vapor cell to determine a measurable parameter.

DETAILED DESCRIPTION

Figure 1:
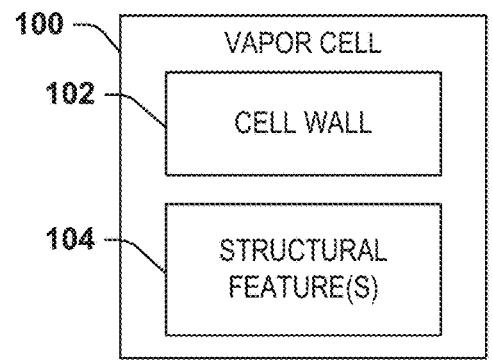
FIG. 1 illustrates an example block diagram of a vapor cell.

The present invention relates generally to sensor systems, and specifically to a vapor cell for atomic physics sensors. For example, the vapor cell can be implemented in nuclear magnetic resonance (NMR) sensors, electron paramagnetic resonance (EPR) sensors, interferometer sensors, and/or electrometer sensors. The vapor cell includes a cell wall formed from an approximately transparent material (e.g., a type of glass material, a transparent ceramic, or a crystal such as quartz). The cell wall can enclose an alkali metal vapor (e.g., rubidium (Rb) or cesium (Cs)), such as in an otherwise evacuated volume, and can include an inner surface and an outer surface. The vapor cell can also include at least one structural feature provided on at least one of the inner surface and the outer surface of the cell wall.

The structural feature(s) can extend along a portion of the respective at least one of the inner surface and the outer surface of the vapor cell, and can be formed in a variety of different ways (e.g., such as rings, ribs, bars, arches, fins, and combinations thereof). As one example, the structural feature(s) can provide structural integrity of the vapor cell, allowing the cell wall of the vapor cell to fabricated very thin to provide for higher transmission of signals (e.g., RF signals) through the cell wall, and thus approximate transparency to the signals, while still maintaining sufficient structural integrity to mitigate breaking based on pressure gradients between the inner and outer surfaces. As another example, the structural feature(s) can be chosen to modify signal propagation to improve sensor performance. For example, the structural feature(s) can present regions of varying dielectric constant that can modify electric, RF, and optical field properties within the vapor cell. In yet another example, the structural feature(s) can present regions of varying magnetic permeability, which can modify magnetic field properties within the cell The structural feature(s) can be provided or formed in any of a variety of ways based on design goals. As a first example, the structural feature(s) can be implemented as integral with the cell wall of the vapor cell. For example, to form the structural feature(s), portions of the cell wall can be etched to a first thickness between the inner and outer surfaces. Therefore, the regions of the cell wall between the etched portions can correspond to the structural feature(s)

having a thickness that is greater than the first thickness. As a second example, the structural feature(s) can be discrete components that are bonded to at least one of the inner and outer surfaces of the cell wall. As an example, such discrete components can have a higher tensile strength than the approximately transparent material from which the cell wall is formed and/or can be formed from a thicker material. In either example, the cell wall can have a lesser surface area devoted to portions of the total surface area on which the structural feature(s) are provided or formed than portions of the total surface area on which the structural feature(s) are absent. Accordingly, the thinner portions of the cell wall can be more prominent to facilitate approximate transparency of the signals (e.g., RF signals) through the cell wall and into the volume of the vapor cell that confines the alkali metal vapor.

FIG. 1 illustrates an example block diagram of a vapor cell 100. The vapor cell 100 can be implemented in any of a variety of atomic physics-based sensors, such as nuclear magnetic resonance (NMR) sensors, electron paramagnetic resonance (EPR) sensors, interferometer sensors, and/or electrometer sensors. The vapor cell 100 can be configured to enclose an alkali metal vapor, such as rubidium (Rb) or cesium (Cs), such as in an otherwise evacuated volume.

In the example of FIG. 1, the vapor cell 100 includes a cell wall 102 formed from an approximately transparent material (e.g., a type of glass material, such as quartz). As described herein, the approximately transparent material can be sufficient to provide a high transmissivity of signals (e.g., optical or radio frequency (RF)) through the cell wall 102, such as greater than or equal to approximately 95%. Therefore, optical beams and RF signals can thus interact with the alkali metal vapor therein. As an example, a detection beam corresponding to an optical beam (e.g., probe beam) exiting the vapor cell 100 can be monitored (e.g., via a detection system) to determine characteristics of the detection beam. The characteristics of the detection beam can be altered by the interaction of the signals with the alkali metal atoms, such as to facilitate measurement of a measurable parameter (e.g., time, rotation, acceleration, magnetic field, and/or electric field).

The cell wall 102 includes an inner surface, which is thus enclosed within the volume of the vapor cell 100, and an outer surface, which is thus exposed to an exterior of the vapor cell 100. In the example of FIG. 1, the vapor cell 100 includes at least one structural feature 104 provided on at least one of the inner surface and the outer surface of the cell wall 102. The structural feature(s) 104 can extend along a portion of at least one of the inner surface and the outer surface of the vapor cell 100. For example, the each of the structural feature(s) 104 can extend along a length of the cell wall 102, can extend around (e.g., circumscribe) the cell wall 102 or can be provided in any of a variety of ways.

As one example, the structural feature(s) 104 can be configured to increase structural integrity of the cell wall 102. The portions of the cell wall 102 on which the structural feature(s) 104 are absent can thus be fabricated to be very thin to provide for higher transmission of signals (e.g., RF signals) through the cell wall 102, and thus approximate transparency to the signals. However, the presence of the structural feature(s) 104 can maintain sufficient structural integrity to mitigate breaking based on pressure gradients between the inner and outer surfaces of the cell wall 102. The structural feature(s) 104 can be provided or formed in any of a variety of ways to provide the sufficient structural integrity while maintaining approximate transparency to incident signals (e.g., both optical and RF) passing through the cell wall 102 and into the vapor cell 100.

As a first example, the structural feature(s) 104 can be formed from a material that is the same as the approximately transparent material that forms the cell wall 102. As a further example, the structural feature(s) 104 can be integral with the cell wall 102 of the vapor cell 100. For example, to form the structural feature(s) 104, portions of the cell wall 102 can be chemically etched to a first thickness between the inner and outer surfaces. Therefore, the regions of the cell wall 102 between the etched portions can correspond to the structural feature(s) having a thickness that is greater than the first thickness. As a second example, the structural feature(s) 104 can be discrete components that are bonded to at least one of the inner and outer surfaces of the cell wall 102. As an example, such discrete components can have a higher tensile strength than the approximately transparent material from which the cell wall 102 is formed and/or can be formed from a thicker material.

The cell wall 102 can have a lesser surface area devoted to portions of the total surface area on which the structural feature(s) 104 are provided or formed than portions of the total surface area on which the structural feature(s) 104 are absent. Therefore, the total surface area of the cell wall 102 that includes the thinner and more highly approximately transparent material can be more prevalent to facilitate greater transmissivity of signals provided through the cell wall 102 to interact with the alkali metal vapor enclosed therein. Accordingly, the cell wall 102 can facilitate approximate transparency of the signals (e.g., RF signals) through the cell wall 102 and into the volume of the vapor cell 100 that confines the alkali metal vapor (e.g., while maintaining sufficient structural integrity to mitigate breakage of the cell wall 102 based on pressure gradients between the inner and outer surfaces of the cell wall 102). For example, given that the volume enclosed by the cell wall 102 is evacuated other than the alkali metal vapor, external pressure can cause the cell wall 102 to implode. Alternatively, for a sensor system that is used in space, the lack of atmospheric pressure can instead cause the cell wall 102 to explode. Regardless, vibrations and/or inertial shock can cause the cell wall 102 to break. However, by implementing structural feature(s) 104, the vapor cell 100 can exhibit sufficient structural integrity to withstand environmental stresses while providing superior transmissivity based on a very thin cell wall 102.

As another example, the structural feature(s) 104 can be alternatively or additionally implemented for a variety of other reasons besides structural integrity of the cell wall 102. As an example, the structural feature(s) 104 can be implemented to affect the signals and/or fields that enter the volume within the vapor cell 100 in a variety of different ways. As an example, by implementing the structural feature(s) 104 as spatially-varying wall thickness of the cell wall 102, a dielectric constant of the material of the cell wall 102 can likewise be spatially-varying. Therefore, the propagation direction, diffraction, and/or reflection properties of RF signals can be affected by the structural feature(s) 104. As another example, by implementing the structural feature(s) 104 as spatially-varying wall thickness of the cell wall 102, the magnetic permeability of the cell wall 102 can be affected in similar ways as to the dielectric described above. Therefore, magnetic fields that pass through the cell wall 102 can be manipulated. As an example, the magnetic permeability can be affected to provide for approximate uniformity of the magnetic fields within the volume of the cell wall 102, or to block spurious magnetic fields from entering the volume within the cell wall 102, thereby mitigating noise effects on the associated sensor or system. Accordingly, the structural feature(s) 104 can be provided for a variety of purposes.

Figure 2:
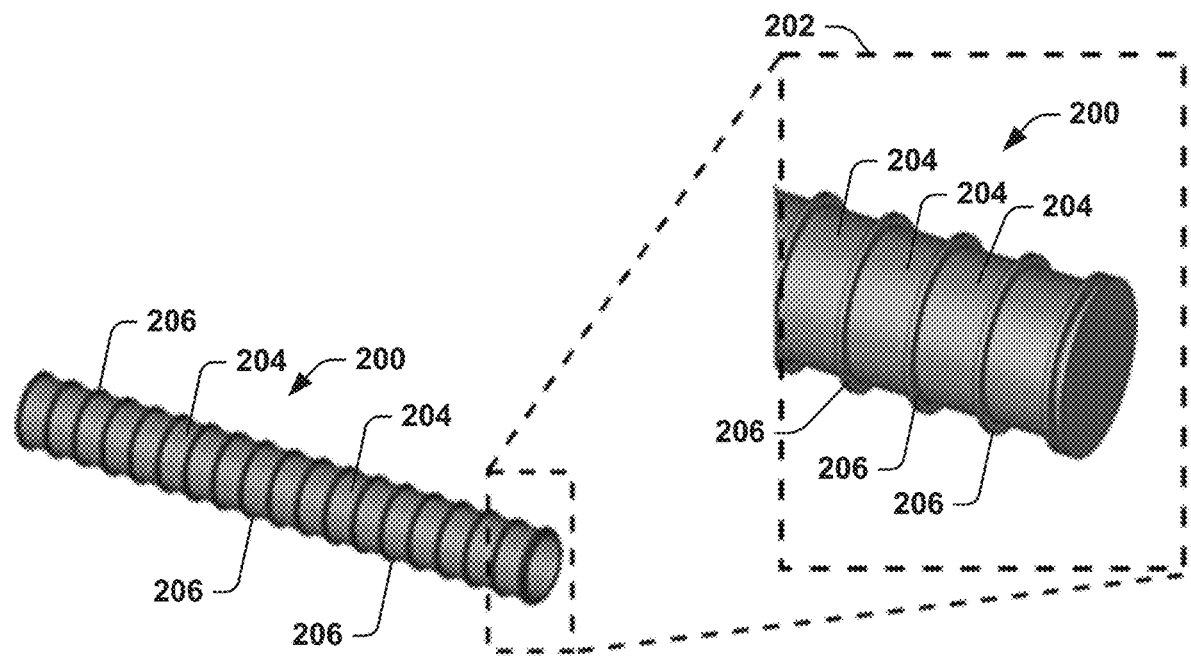
FIG. 2 illustrates an example diagram of a vapor cell.

FIG. 2 illustrates an example diagram of a vapor cell 200. The vapor cell 200 can be implemented in any of a variety of atomic physics-based sensors, such as NMR sensors, EPR sensors, interferometer sensors, and/or electrometer sensors. The vapor cell 200 can be configured to enclose an alkali metal vapor, such as Rb or Cs, such as in an otherwise evacuated volume. The example of FIG. 2 illustrates an exploded view 202 to provide a more magnified illustration of a portion (e.g., one end) of the vapor cell 200. The vapor cell 200 can correspond to the vapor cell 100 in the example of FIG. 2. Therefore, reference is to be made to the example of FIG. 1 in the following description of the example of FIG. 2.

In the example of FIG. 2, the vapor cell 200 is demonstrated as being cylindrical, and thus having a tubular shape. While the specific example of FIG. 2 is demonstrated as cylindrical, other tubular arrangements (e.g., a rectangular, square, or triangular cross-sectional prism) are also possible. The vapor cell 200 includes a cell wall 204 formed from an approximately transparent material (e.g., a type of glass material, such as quartz). Therefore, optical beams and RF signals can thus interact with the alkali metal vapor therein. Similar to as described above in the example of FIG. 2, the cell wall 204 includes an inner surface, which is thus enclosed within the volume of the vapor cell 200, and an outer surface, which is thus exposed to an exterior of the vapor cell 200.

In the example of FIG. 2, the vapor cell 200 also includes a plurality of structural features 206 provided on the outer surface of the cell wall 204. The structural features 206 are demonstrated as an array of rings periodically provided along the length of the tubular shape of the vapor cell 100. The rings that constitute the structural features 206 are parallel with respect to each other and extend around the cross-section of the vapor cell 100, such that the rings circumscribe the cell wall 102. The portions of the cell wall 204 on which the structural features 206 are absent can thus be fabricated to be very thin to provide for higher transmission of signals (e.g., RF signals) through the cell wall 204, and thus approximate transparency to the signals. However, as one example, the presence of the structural features 206 can maintain sufficient structural integrity of the cell wall 204. As another example, the structural features 206 can affect the properties of the cell wall 204, such as with respect to dielectric and/or magnetic permeability of the cell wall 204. Therefore, the structural features 206 can also or instead be implemented to affect RF signals and/or magnetic fields that pass through the cell wall 204.

As described above, the structural features 206 can be provided or formed in any of a variety of ways to provide the sufficient structural integrity while maintaining approximate transparency to incident signals (e.g., both optical and RF) passing through the cell wall 204 and into the vapor cell 200. As a first example, the structural features 206 can be integral with the cell wall 204 of the vapor cell 200. For example, to form the structural features 206, the material that forms the vapor cell 100 can be etched about a cross-sectional periphery at periodic portions. Therefore, the unetched portions of the material can form the structural features 206 merely by being unetched, and therefore remaining thicker with respect to the cross-section of the vapor cell 200. The etched portions can therefore correspond to the cell wall 204 between each of the structural features 206. The etched portions corresponding to the cell wall 204 can therefore be much thinner with respect to the cross-section of the vapor cell 200 than the structural features 206.

The portions of the cell wall 204 on which the structural features 206 are absent can constitute a much larger overall portion of the total surface area of the cell wall 204 than the portions of the cell wall 204 on which the structural features 206 are present. Stated another way, given that the structural features 206 and the cell wall 204 are integral with respect to each other, the cell wall 204 can constitute a much larger overall portion of the total surface area of the outer surface of the vapor cell 200 than the structural features 206. Therefore, as one example, based on the much thinner material of the cell wall 204 combined with the larger surface area of the cell wall 204 relative to the structural features 206, the vapor cell 200 can exhibit greater transmissivity of signals provided through the cell wall 204 to interact with the alkali metal vapor enclosed therein. Accordingly, the cell wall 204 can facilitate approximate transparency of the signals (e.g., RF signals) through the cell wall 204 and into the volume of the vapor cell 200 that confines the alkali metal vapor, such as while maintaining sufficient structural integrity to mitigate breakage of the cell wall 204 base on pressure gradients between the inner and outer surfaces of the cell wall 204.

The vapor cell 200 is provided by example, and other arrangements are possible. For example, the structural features 206 can be implemented in any of a variety of other ways than the ring structures demonstrated in the example of FIG. 2. Examples include one or more elongated portions that extend along the tubular length of the vapor cell 200, a helical or crisscross pattern along the tubular length of the vapor cell 200, chevrons, patches, or other types of arrangements of the structural features 206. Therefore, the vapor cell 200 can be implemented in any of a variety of ways.

Figure 3:
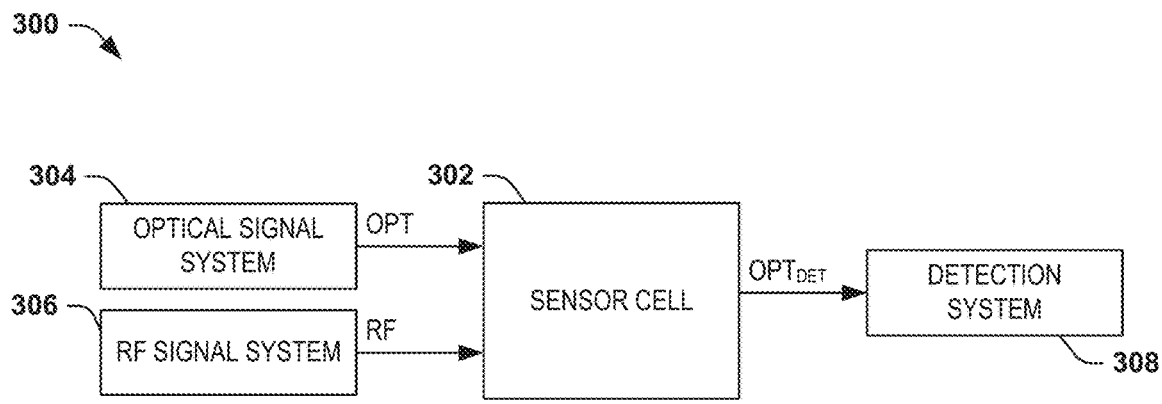
FIG. 3 illustrates an example of an atomic physics-based sensor.

FIG. 3 illustrates an example of an atomic physics-based sensor system 300. The sensor system 300 can correspond to an NMR sensor, an EPR sensor, an interferometer sensor, or an electrometer sensor. Therefore, the sensor system 300 can be implemented to measure any of a variety of measurable parameters, such as time, rotation, acceleration, magnetic field, and/or electric field.

The sensor system 300 includes a vapor cell 302 that can be configured as a sealed glass container that includes a vapor of alkali metal atoms. The vapor cell 302 can correspond, for example, to the vapor cells 100 and/or 200 described above in the respective examples of FIGS. 1 and 2. The sensor system 300 also includes an optical signal system 304 that is configured to generate at least one optical beam, demonstrated in the example of FIG. 3 as a signal OPT. As an example, the optical signal system 304 can include a probe laser and at least one coupling laser to generate a probe beam and at least one coupling beam, respectively. As another example, the optical signal system 304 can include a pump laser and a probe laser for generating separate respective pump and probe beams. Each of the optical beams OPT can be provided through the vapor cell 302 via optics (not shown), such as to provide interaction with the alkali metal vapor therein (e.g., to provide optical pumping and/or energy state transitions). In the example of FIG. 3, one of the optical beams OPT can exit the vapor cell 302 as a detection beam $OPT_{DET}$.

The sensor system 300 also includes a signal system 306 that is configured to generate any of a variety of signals or fields, demonstrated in the example of FIG. 3 as a signal SIG. As an example, the signal system 306 can include a splitting signal generator that is configured to generate the signal SIG as a splitting signal that is provided at a predetermined frequency and a predetermined amplitude through the vapor cell 302 to split a frequency-spectrum transparency peak corresponding to the first Rydberg energy state of the alkali metal atoms into a pair of Autler-Townes frequency-spectrum transparency peaks associated with the alkali metal atoms. As another example, the signal system 306 can include a tuning signal generator that can generate a tuning RF signal to adjust an energy difference between Rydberg energy states of the alkali metal atoms. The signal system 306 can also or instead include a magnetic field generator that is configured to generate one or more magnetic fields that are provided through the vapor cell 302, such as to provide for precession of the alkali metal vapor contained in the vapor cell 302. As described herein, the arrangement of the cell wall and the structural feature(s) of the vapor cell 302 can be such that the cell wall of the vapor cell 302 can be approximately transparent to the signal RF, thus providing greater interaction of the alkali metal vapor with the signal SIG, such as while maintaining sufficient structural integrity to mitigate breakage of the vapor cell 302. As another example, the structural feature(s) of the vapor cell 302 can be such that the signal SIG (e.g., RF signal(s) and/or magnetic field(s)) can be manipulated as the signal SIG passes through the cell wall of the vapor cell 302.

The sensor system 300 further includes a detection system 308 that is configured to monitor the detection beam $OPT_{DET}$. For example, the detection system 308 can monitor a characteristic of the detection beam $OPT_{DET}$ that is based on the interaction of the alkali metal atoms with the optical beam(s) OPT and the signal RF, as well as an external stimulus (e.g., acceleration, rotation, an external RF signal, an external magnetic field, etc.). As an example, the characteristic of the detection beam $OPT_{DET}$ can be intensity, phase, Faraday rotation, or any of a variety of other optical beam characteristics. The detection system 308 can include a photodetector that can monitor the characteristic. Therefore, an associated processor (not shown) can be implemented to measure the measurable parameter based on the monitored characteristic.

Accordingly, based on the cell wall and the structural feature(s) of the vapor cell 302 as described herein, the sensor system 300 can be implemented in any of a variety of hostile environments to provide for accurate determination of the measurable parameter while maintaining sufficient structural integrity of the cell wall of the vapor cell 302.

Figure 4:
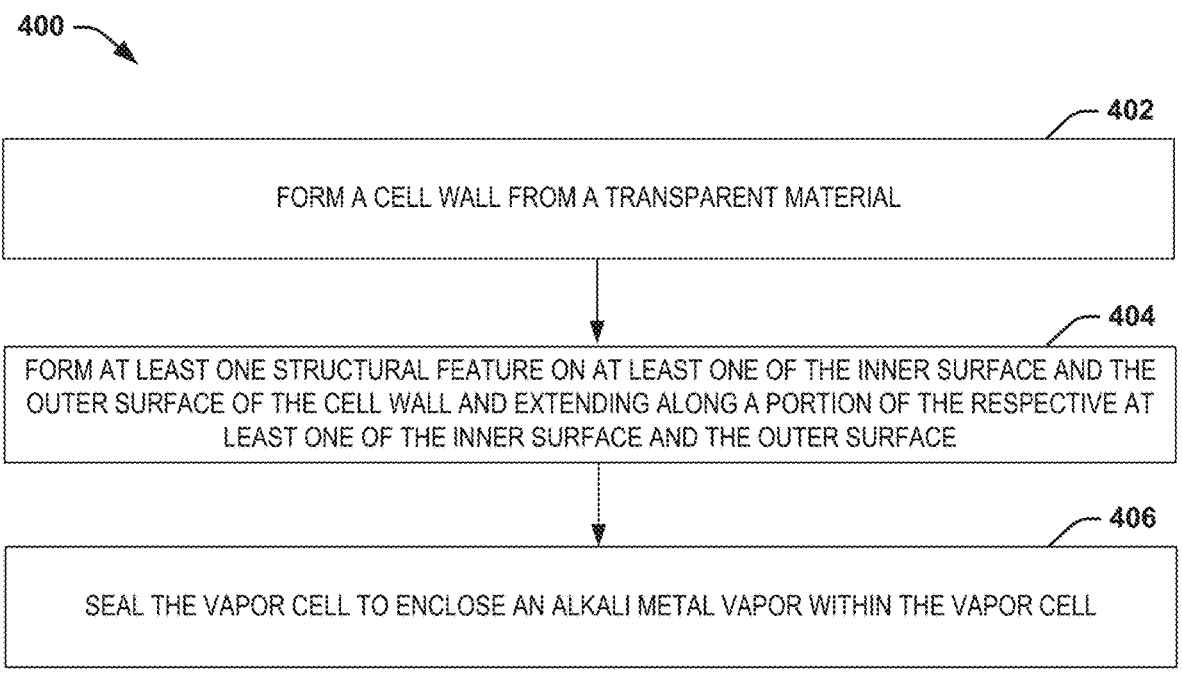
FIG. 4 illustrates an example of a method for fabricating a vapor cell for an atomic physics-based sensor.

In view of the foregoing structural and functional features described above, a methodology in accordance with various aspects of the disclosure will be better appreciated with reference to FIG. 4. It is to be understood and appreciated that the method of FIG. 4 is not limited by the illustrated order, as some aspects could, in accordance with the present disclosure, occur in different orders and/or concurrently with other aspects from that shown and described herein. Moreover, not all illustrated features may be required to implement a methodology in accordance with an aspect of the present examples.

FIG. 4 illustrates an example of a method 400 for forming a vapor cell (e.g., the vapor cell 100) for an atomic physics-based sensor system (e.g., the sensor system 300). At 402, a cell wall (e.g., the cell wall 102) is formed from an approximately transparent material. The cell wall can include an inner surface and an outer surface. At 404, at least one structural feature (e.g., the structural feature(s) 104) is formed on at least one of the inner surface and the outer surface of the cell wall and extending along a portion of the respective at least one of the inner surface and the outer surface. At 406, the vapor cell is sealed to enclose an alkali metal vapor (e.g., Rb or Cs) within the vapor cell.

What have been described above are examples of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims. Additionally, where the disclosure or claims recite "a," "an," "a first," or "another" element, or the equivalent thereof, it should be interpreted to include one or more than one such element, neither requiring nor excluding two or more such elements. As used herein, the term "includes" means includes but not limited to, and the term "including" means including but not limited to. The term "based on" means based at least in part on.

What is claimed is:

1. A vapor cell for an atomic physics-based sensor system, the vapor cell comprising:
   a cell wall formed from an approximately transparent material, the cell wall enclosing an alkali metal vapor and comprising an inner surface and an outer surface, the cell wall having a first thickness between the inner surface and the outer surface; and
   at least one structural feature formed integral with the cell wall and extending along a portion of at least one of the inner surface and the outer surface, each of the at least one structural feature being arranged as a portion of the cell wall having a thickness that is greater than the first thickness to increase structural integrity of the cell wall.

2. The cell of claim 1, wherein the respective one of the inner surface and the outer surface of the cell wall on which the at least one structural feature is provided has a total surface area comprising a first portion of the total surface area on which the at least one structural feature is provided and a second portion of the total surface area on which the at least one structural feature is absent, the second portion of the total surface area being greater than the first portion of the total surface area.

3. The cell of claim 1, wherein the at least one structural feature is formed from the approximately transparent material.

4. The cell of claim 1, wherein the at least one structural feature is formed from chemical etching portions of the outer surface of the cell wall to form the at least one structural feature between the etched portions of the outer surface of the cell wall.

5. The cell of claim 1, wherein the cell wall is arranged as a tubular vapor cell, wherein the at least one structural feature is formed as rings that circumscribe the respective one of the outer surface and the inner surface of the cell wall and are arranged parallel with respect to each other along a length of the tubular vapor cell.

6. The cell of claim 1, wherein the at least one structural feature is arranged as a respective at least one discrete component that is bonded to the at least one of the outer surface and the inner surface.

7. A physics-based sensor system comprising the vapor cell of claim 1.

8. A method for forming a vapor cell for an atomic physics-based sensor system, the method comprising:
   forming a cell wall from an approximately transparent material, the cell wall comprising an inner surface and an outer surface and having a first thickness between the inner surface and the outer surface;

forming at least one structural feature integral with the cell wall and extending along a portion of the respective at least one of the inner surface and the outer surface, each of the at least one structural feature having a thickness that is greater than the first thickness to provide regions of varying dielectric constant of the cell wall; and sealing the vapor cell to enclose an alkali metal vapor within the vapor cell.

9. The method of claim 8, wherein the respective one of the inner surface and the outer surface of the cell wall on which the at least one structural feature is formed has a total surface area comprising a first portion of the total surface area on which the at least one structural feature is formed and a second portion of the total surface area on which the at least one structural feature is absent, the second portion of the total surface area being greater than the first portion of the total surface area.

10. The method of claim 8, wherein forming the at least one structural feature integral with the cell wall comprises chemical etching portions of the outer surface of the cell wall to form the at least one structural feature between the etched portions of the outer surface of the cell wall.

11. The method of claim 8, wherein forming the cell wall comprises forming the cell wall as a tubular vapor cell, wherein forming the at least one structural feature comprises forming the at least one structural feature as rings that circumscribe the respective one of the outer surface and the inner surface of the cell wall and are arranged parallel with respect to each other along a length of the tubular vapor cell.

12. A vapor cell for an atomic physics-based sensor system, the vapor cell comprising:

a cell wall formed from an approximately transparent material, the cell wall enclosing an alkali metal vapor and comprising an inner surface and an outer surface; and at least one structural feature provided on at least one of the inner surface and the outer surface of the cell wall and extending along a portion of the respective at least one of the inner surface and the outer surface, the at least one structural feature comprising at least one discrete component that is bonded to the at least one of the outer surface and the inner surface to increase structural integrity of the cell wall.

13. The cell of claim 12, wherein the respective one of the inner surface and the outer surface of the cell wall on which the at least one structural feature is provided has a total surface area comprising a first portion of the total surface area on which the at least one structural feature is provided and a second portion of the total surface area on which the at least one structural feature is absent, the second portion of the total surface area being greater than the first portion of the total surface area.

14. The cell of claim 12, wherein the at least one structural feature is formed from the approximately transparent material.

15. The cell of claim 12, wherein the cell wall has a first thickness between the inner surface and the outer surface, wherein each of the at least one structural feature is arranged as a portion of the cell wall having a thickness that is greater than the first thickness.

16. A vapor cell for an atomic physics-based sensor system, the vapor cell comprising:

a cell wall formed from an approximately transparent material, the cell wall enclosing an alkali metal vapor and comprising an inner surface and an outer surface; and at least one structural feature provided on at least one of the inner surface and the outer surface of the cell wall and extending along a portion of the respective at least one of the inner surface and the outer surface, the at least one structural feature comprising at least one discrete component that is bonded to the at least one of the outer surface and the inner surface to provide regions of varying dielectric constant of the cell wall.

17. The cell of claim 16, wherein the respective one of the inner surface and the outer surface of the cell wall on which the at least one structural feature is provided has a total surface area comprising a first portion of the total surface area on which the at least one structural feature is provided and a second portion of the total surface area on which the at least one structural feature is absent, the second portion of the total surface area being greater than the first portion of the total surface area.

18. The cell of claim 16, wherein the at least one structural feature is formed from the approximately transparent material.

19. The cell of claim 16, wherein the cell wall has a first thickness between the inner surface and the outer surface, wherein each of the at least one structural feature is arranged as a portion of the cell wall having a thickness that is greater than the first thickness.

* * * * *